(12) United States Patent
Gruijters et al.

(10) Patent No.: US 7,853,860 B2
(45) Date of Patent: Dec. 14, 2010

(54) PROGRAMMABLE SIGNAL AND PROCESSING CIRCUIT AND METHOD OF DEPUNCTURING

(75) Inventors: Paulus W. F. Gruijters, Eindhoven (NL); Marcus M. G. Quax, Eindhoven (NL)

(73) Assignee: Silicon Hive B.V., Eindhoven (NL)

( * ) Notice: Subject to any disclaimer, the term of this patent is extended or adjusted under 35 U.S.C. 154(b) by 139 days.

(21) Appl. No.: 11/721,053

(22) PCT Filed: Dec. 13, 2005

(86) PCT No.: PCT/IB2005/054204

§ 371 (c)(1),
(2), (4) Date: Aug. 5, 2009

(87) PCT Pub. No.: WO2006/064463

PCT Pub. Date: Jun. 22, 2006

(65) Prior Publication Data

US 2009/0287911 A1  Nov. 19, 2009

(30) Foreign Application Priority Data

Dec. 14, 2004 (EP) .................................. 04106559

(51) Int. Cl.
*H03M 13/03* (2006.01)

(52) U.S. Cl. .......................... 714/790; 712/35; 712/225; 712/300

(58) Field of Classification Search ................. 714/790; 712/35, 225, 300
See application file for complete search history.

(56) References Cited

U.S. PATENT DOCUMENTS

| 5,151,904 A * | 9/1992 | Reiner et al. ................. 714/795 |
| 6,684,366 B1 * | 1/2004 | Trott et al. .................... 714/790 |
| 7,095,792 B2 * | 8/2006 | Doetsch et al. ............. 375/265 |
| 7,114,121 B2 * | 9/2006 | Oda ........................... 714/790 |
| 7,284,185 B2 * | 10/2007 | Chen .......................... 714/790 |

* cited by examiner

*Primary Examiner*—William M Treat
(74) *Attorney, Agent, or Firm*—Leydig, Voit and Mayer Ltd

(57) ABSTRACT

A programmable signal processing circuit has an instruction processing circuit (23, 24, 26), with an instruction set that comprises a depuncture instruction. The instruction processing circuit (23, 24, 26) forms the depuncture result by copying bit metrics from a bit metrics operand and inserting one or more predetermined bit metric values between the bit metrics from the bit metric operand in the depuncture result. The instruction processing circuit (23, 24, 26) changes the relative locations of the copied bit metrics with respect to each other in the depuncture result as compared to the relative locations of the copied bit metrics with respect to each other in the bit metric operand, to an extent needed for accommodating the inserted predetermined bit metric value or values.

24 Claims, 4 Drawing Sheets

PROGRAMMABLE SIGNAL AND PROCESSING CIRCUIT AND METHOD OF DEPUNCTURING

Figure 1:
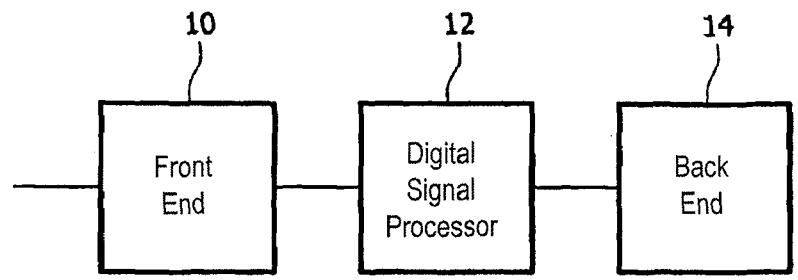

The invention relates to a programmable signal processing circuit and to a method of de-puncturing an Error Correcting Code.

The DVB (Digital Video Broadcast) standard provides for transmission of encoded television signals. To decode these signals a number of steps have to be performed, which include error correction decoding preceded by "de-puncturing" of the transmitted signals. De-puncturing is the counterpart of puncturing, which is performed after encoding in an Error Correcting Code (ECC) and before transmission. Puncturing involves removal of bits from selected positions to reduce the number of bits that has to be transmitted. This is done to an extent that still allows recovery of the encoded data during decoding with the ECC. The DVB standard defines the positions where such punctured bits must be removed.

During decoding predetermined bit values are reinserted at these positions before the data is decoded according to the ECC, i.e. typically before Viterbi decoding is applied to the data. Known implementations of this type of de-puncturing normally use a dedicated hardware circuit that receives a stream of input bits, and while outputting the bits of that input stream, detects when the input stream has reached a puncture location and inserts new bits in the output stream at such a location. The depunctured stream is then passed to dedicated hardware to perform Viterbi decoding. Alternatively, the depunctured stream may be chopped into chunks, each with a predetermined number of bits that can be stored together in a register of a programmable processor, and the processor can be used to perform Viterbi decoding using these operands.

An alternative implementation involves the use of a programmable signal processing circuit to perform depuncturing as well. However, due to the bit-manipulation nature of depuncturing such an implementation typically involves execution of a considerable number of instructions. This puts higher demands on the speed of the circuit and increases power consumption, because many instructions have to be executed. This is a particular problem in VLIW (Very Large Instruction Word) implementations, since loading of very large instruction words consumes a relatively large amount of power consumption.

Among others, it is an object of the invention to reduce the number of instruction execution cycles that is needed to perform depuncturing with a programmable signal processing circuit.

Among others, it is an object of the invention to provide for a method of depuncturing wherein programmable instructions that have register operands that contain a predetermined plurality of bits can be used to perform depuncturing.

Among others, it is an object of the invention to provide for a method of depuncturing wherein variations in the number of bits from a punctured stream that are copied from operand registers into depunctured result registers can be handled with little overhead with a programmable signal processor that uses registers of a standard width.

Among others, it is an object of the invention to reduce the number of instruction execution cycles that is needed to perform depuncturing with a programmable signal processing circuit in a DVB transmission system.

Among others, it is an object of the invention to provide for a programmable signal processing circuit that makes it possible to reduce the number of instruction execution cycles that is needed to perform depuncturing.

Among others, it is an object of the invention to minimize the number of instructions that must be loaded in a program loop of a programmable signal processing circuit to apply depuncturing to a stream of data.

Among others, it is an object of the invention to provide for an efficient method of depuncturing using a programmable signal processing circuit.

The invention provides for a programmable signal processing circuit according to Claim 1. This programmable signal processing circuit has an instruction set that comprises a depuncture instruction. In response to the depuncture instruction an instruction processing circuit forms a depunctured result by copying bit metrics from a bit metrics operand and inserting predetermined bit metric values between the bit metrics from the bit metric operand in the depuncture result, changing the relative locations of the copied bit metrics relative to each other in the depuncture result as compared to the relative locations of the copied bit metrics relative to each other in the bit metric operand to accommodate the inserted predetermined bit metric value or values. The term "bit metric" is used for a group of one or more bits that represents received information about a single transmitted bit.

By providing a specialized instruction for forming results wherein predetermined bit metric values can be accommodated at puncture locations, depuncturing can be performed at high speed using a programmable processor. In an embodiment the depuncture instruction has a further operand that controls the locations where predetermined bit metric values are inserted. Alternatively, different depuncture instructions may be provided to define different insertion locations.

Various embodiments are possible for inserting the predetermined bit pattern values. In a first embodiment the instruction processing circuit comprises at least one bit metric multiplexing circuit for this purpose. The multiplexing circuit selects to supply predetermined bit metric value to a bit metric field in the depuncture result or one of the bit metrics from the bit metric operand, dependent whether the pattern operand indicates that a bit metric should be copied from the bit metric operand to said part of the depuncture result and on a number of bit metrics that the pattern operand indicates should be copied in further parts of the depuncture result that precede said part of the depuncture result. This embodiment requires a minimum amount of latency. Typically, a plurality of such multiplexing circuits will be used, each for a respective bit metric position in the depuncture result. As an alternative, a controllable shift circuit may be used to select the bit metric that will be passed to the field of the depuncture result. In this case the predetermined bit metric value may be substituted by a substitution circuit after shifting, or the predetermined bit metric value may be a part of the shifted data that is selected by using an appropriate shift value under control of a desired puncture pattern.

In further embodiments the depuncture instruction or a further instruction are provided to form a queue in a register that will be used result as bit metric operand for a subsequent execution of the depuncture instruction. This queue result contains bit metrics that have not yet been used to form a depuncture result. The queue result may be used to accommodate for the fact that a variable, puncture pattern dependent number of bit metrics from the bit metric operand is not copied to the depuncture result. These remaining bit metrics may be copied selectively to the queue result for later use as bit metric operand. The queue result may also be used to accumulate bit metrics in the bit metric operand until it, alone or in combination with a further bit metric operand, contains sufficient bit metrics to form a depuncture result. Preferably, the instruction set of the programmable processor provides for a depuncture instruction in response to which the signal processor forms both the queue result and the depuncture result. This minimizes access to the register file and leaves more room for other instructions in the instruction set. Alternatively, a special queue result forming instruction may be provided, which uses the pattern operand and the bit metrics operand to form the queue result.

In a further embodiment the depuncture instruction or the further instruction receives a further bit metric operand, which contains a chunk from the stream of bit metrics with a predetermined number of bit metrics. A queue length code operand is used to specify a number of bit metrics in the bit metric operand and the queue result is formed by including bit metrics that, according to the pattern operand, are not copied into the depuncture result in response to the depuncture instruction, so that a pattern operand dependent number of bit metrics is combined in the queue result with bit metrics from the further bit metric operand.

Preferably, the depuncture instruction or the further instruction produces a queue length result that indicates a number of bit metrics in the queue result, for use by a future execution of the depuncture instruction. Preferably the queue length is incremented to incorporate bit metrics from the further bit metric operand only if there is sufficient room in the queue result for copying all bit metrics from the further bit metric operand into the queue result, in addition to bit metrics from the bit metric operand that have not been used in the depuncture result. If not, execution of the depuncture instruction or the further instruction is repeated with the same further bit metric operand. This makes it easier to accommodate for rate differences between the input and output stream.

In another embodiment a length value is supplied in the pattern operand in addition to a depuncture pattern. This length value may be used in response to the depuncture instruction or the further instruction to control a number of bit metric values that is copied from the further bit metric operand into the queue result. This reduces latency during queuing In another embodiment the depuncture instruction or the further instruction requires a further bit metric operand that contains a chunk from the stream of bit metrics with a predetermined number of bit metrics. The depuncture result is formed by placing a pattern operand dependent number of bit metrics from the bit metric operand into the depuncture result, if said number of bit metrics in the bit metric operand is enough to supply sufficient copies for use in the depuncture result. This makes it possible to produce valid depuncture results with a predetermined number of bit metrics at a high rate. When the number of bit metrics is insufficient a flag result is preferably produced to prevent use of the depuncture result. In this case all of the bit metrics from the bit metric operand and as many bit metrics from the further bit metric operand as practicable are preferably copied to the queue result, so that it will be possible to produce a valid depuncture result later on.

These and other objects and advantageous aspects of the invention will be illustrated from description of the following figures that show non-limitative examples of the invention.

Figure 2:
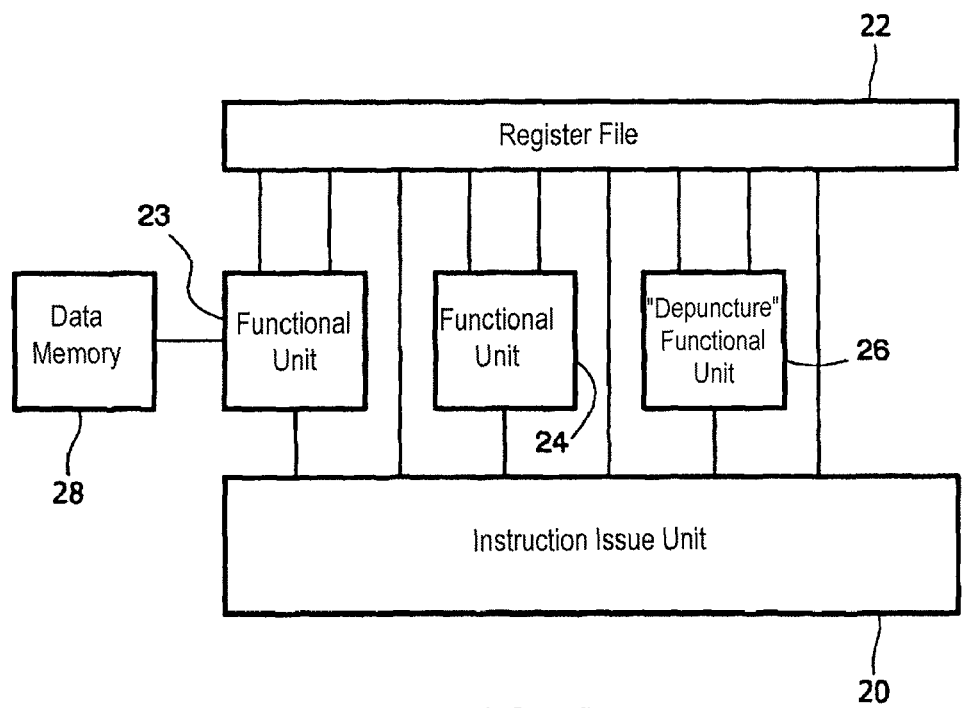
Figure 3:
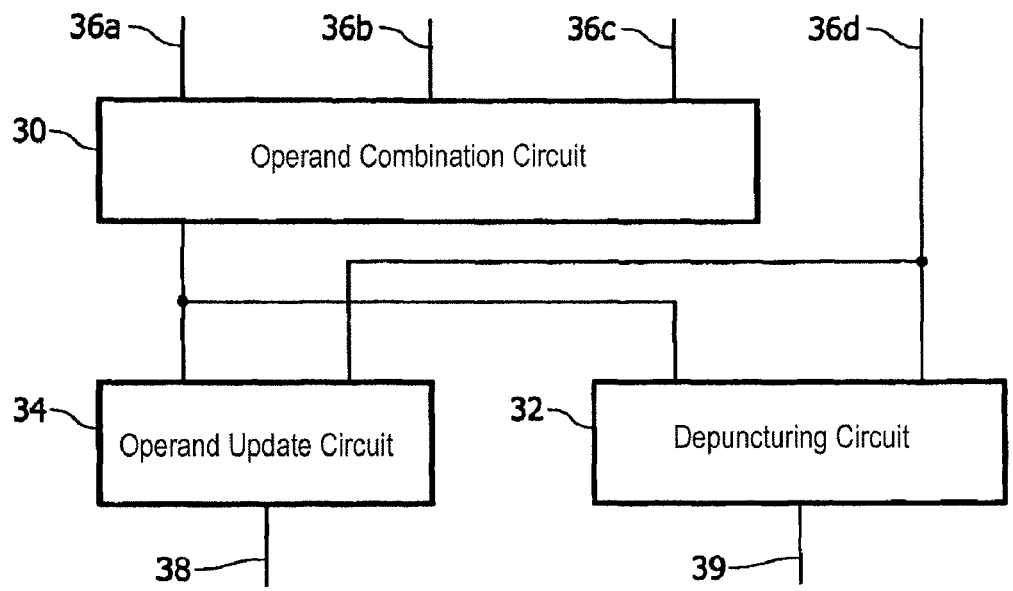
Figure 4:
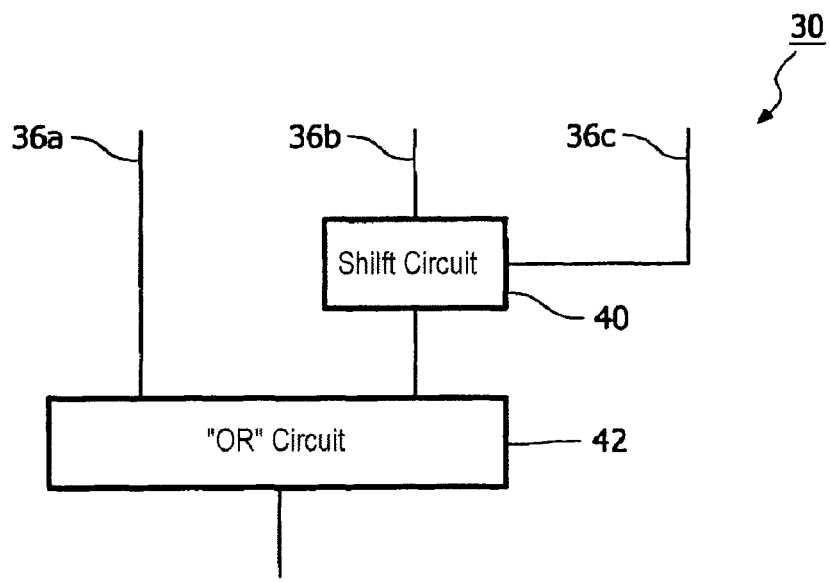
Figure 5:
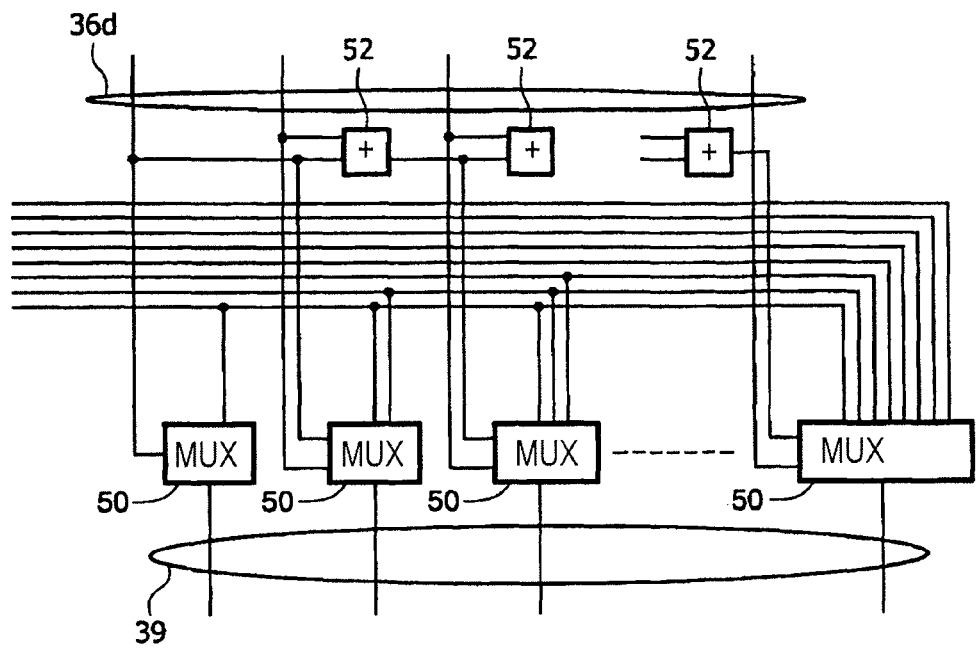
Figure 6:
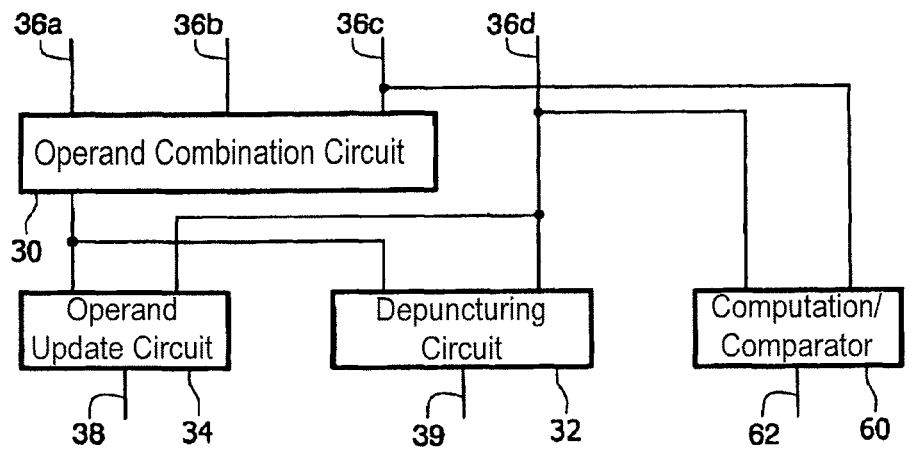
Figure 7:
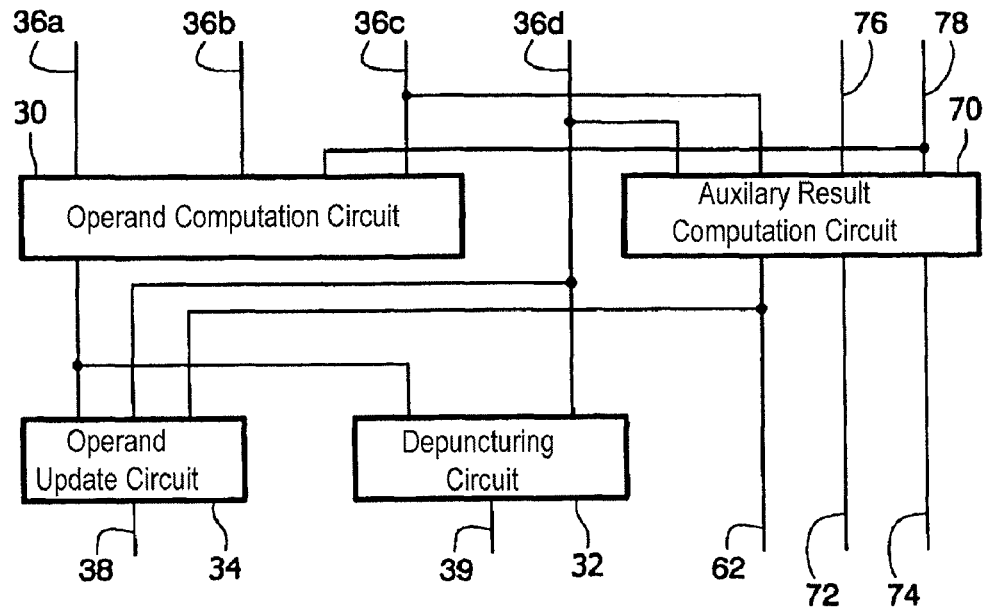
Figure 8:
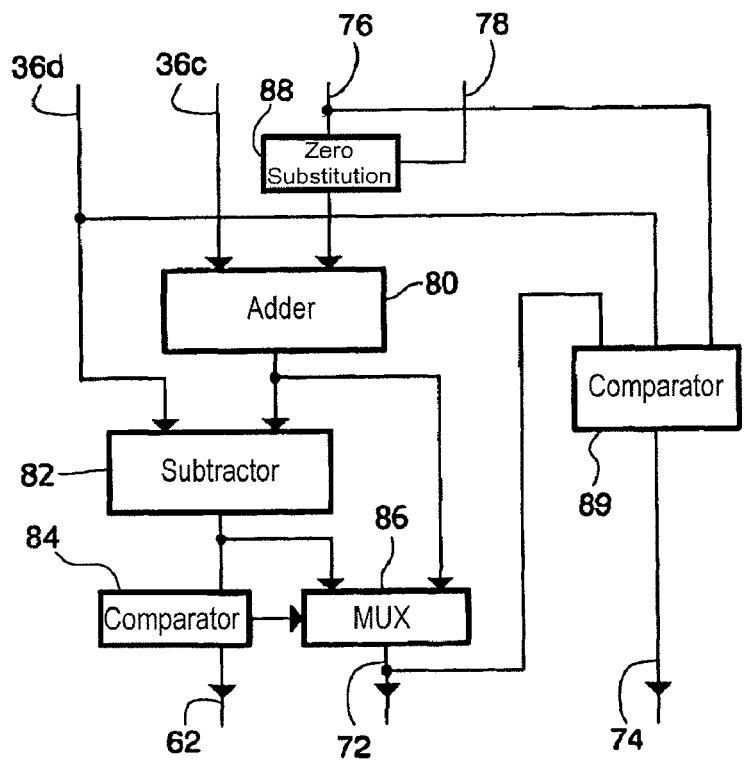

FIG. 1 shows signal receiver apparatus
FIG. 2 shows a programmable signal processing circuit
FIG. 3 shows a depuncture functional unit
FIG. 4 shows an operand update circuit
FIG. 5 shows a depuncturing circuit
FIG. 6 shows a further depuncture functional unit
FIG. 7 shows a further depuncture functional unit
FIG. 8 shows an auxiliary result computation circuit FIG. 1 shows a signal receiver apparatus, such as a DVB (Digital Video Broadcast) receiver apparatus. The apparatus contains a front end 10, a digital signal processing circuit 12 and a back end 14 connected in cascade. Front end 10 has an input for receiving a video broadcast signal. In operation front end 10 receives the video broadcast signal and retrieves digital information from the signal. Digital signal processing circuit 12 receives the digital information and processes the digital information to form a video data signal. Digital signal processing circuit supplies the video data signal to back end 14, which may generate, for example, display data for a connected video display screen (not shown) or storage data for a connected video recording device (not shown). Back end 14 may contain a video display screen and/or recording device itself for these purposes.

Digital signal processing circuit 12 comprises a programmable signal processing circuit that is programmed with a program to perform such operations as demodulation (using digital signal samples to reconstruct data items that have been used to modulate the sampled signal) and decoding of demodulated data items according to an Error Correcting Code (ECC).

The invention relates to de-puncturing of data in digital signal processing circuit 12. Prior to decoding digital signal processing circuit 12 de-punctures the data. De-puncturing is the reverse of puncturing, which is performed on the transmitter side. Selected bits of the ECC encoded data are not transmitted to reduce the data rate of transmitted data On the reception side, default values are substituted for not-transmitted bits prior to using the received signal for error correction according to the ECC.

FIG. 2 shows a programmable signal processing circuit from digital signal processing circuit 12. The programmable signal processing circuit comprises an instruction issue unit 20, a register file 22, a plurality of functional units 23, 24, 26 and a data memory 28. Instruction issue unit 20 stores a program for the digital signal processing circuit, and is arranged to retrieve the instructions as determined by program flow during execution of the program. Instruction issue unit 20 has operation control outputs coupled to functional units 24,26 for supplying control signals that are determined by the operation codes of the instructions, which identify the operations that must be executed by the functional units 23, 24, 26. Instruction issue unit 20 has register selection outputs coupled to ports of register file 22, for supplying selection signals that indicate the registers that contain operands of the instructions and the registers wherein results of the instructions must be stored. The instructions contain fields that control the selection signals. Output ports of register file 22 are coupled to the functional units 23, 24, 26 for supplying operands from the selected registers and input ports of register file 22 are coupled to the functional units 23, 24, 26 to receive results of execution of the instructions.

Although single lines are shown to indicate communication connections for supplying control codes, register selection codes, operands and results, it will be appreciated that in practice many conductors will be used in parallel in the implementation of such connections. A single line may represent connections for supplying a plurality of register selection codes, or for supplying a plurality of operands or for returning a plurality of results. Furthermore, although three functional units 23, 24, 26 are shown, each with its own connections to instruction issue unit 20 and register file 22 it will be appreciated that in practice more functional units may be present, or fewer, if the functions of different functional units are grouped into a functional units that share common connections to register file 22.

The functional units define an "instruction set" that consists of all types of instructions that can be executed by the processor. As used herein, "instructions" are the basic units of the program that select operations that will be performed by individual functional units. Instructions are the "atoms" of the program that can be split further into units that can serve as instructions. Typically, each instruction has a single op code (operation code) that identifies the instruction. As is well known, design of a programmable processor typically starts from the specification of the instruction set, the specification of the instruction set providing the skilled person sufficient information to select at least a basic implementation of the processor.

A first functional unit 23 is a memory access functional unit that is coupled to data memory 28. This memory access functional unit 23 is designed to execute "LOAD" and "STORE" instructions, with operands that specify addresses of locations in data memory 28. Data memory 28 may also be coupled to front end 10 (not shown) and/or back end 14 (not shown) for receiving signal data and transmitting video data. A second functional unit 24 (which may in fact contain a group of functional unit) is designed to execute conventional instructions, such as ALU instructions like ADD, SHIFT etc. Although not shown, further functional units may be present, for example so that several instructions can be executed in parallel, or different instructions can be executed (e.g. input of signal data from front end 10 (not shown) and/or output of video data to back end 14 (not shown)).

During processing of received data, operands of the functional units typically represents each bit from the received signal by means of a plurality of operand bits (e.g. 4 operands bits) per received bit, to indicate certainty about the received bit value. Such a plurality of operand bits will be referred to as a "bit metric". However, without deviating from the invention, a single operand bit may be used to represent a received bit. In this case "bit metric" refers to such a single bit.

The program of the programmable instruction processor provides for de-puncturing of signal data. A specialized third functional unit 26 is provided to execute instructions that are provided for the purpose of de-puncturing. In one embodiment instructions of the type that are executed by this depuncturing functional unit 26 can be denoted by

DEPUNCTURE R1, R2, R3, R4, R5, R6

In this denotation R1, R2 etc. denote register selection codes that identify registers in register file 22 that are used to provide operands and to write results of the instruction. However, instructions will be described herein colloquially by saying that R1 etc. "is" a register. This should be understood to mean that R1 etc. denotes a selection code that identifies a register in register file 22. Even more colloquially it will be said that R1 etc. "is an operand". This should also be understood to mean that R1 etc. denotes a selection code that identifies a register in register file 22 that contains the operand.

In this denotation DEPUNCTURE denotes the op-code that identifies the instruction, R1, R2 are operand registers that contain bit metrics for received bits. R3 is an operand register that contains a length code. R4 is an operand register that contains a pattern code. R5 is a result register into which bit metrics from registers R1 and optionally R2 plus inserted default bit metrics will be written. R6 is a result register into which further bit metrics from registers R1 and R2 will be written.

When the instruction is executed, bit metrics from registers R1 and optionally R2 are copied to register R5, with additional inserted default bit-metrics. Dependent on the operands part of the remaining bit metrics from registers R1, R2 are output to register R6. The purpose of register R6 is that execution of the instruction may be repeated with register R6 functioning as operand register R1.

FIG. 3 shows an embodiment of a depuncture functional unit 26. The depuncture functional unit contains an operand combination circuit 30, a depuncturing circuit 32 and an operand update circuit 34. The depuncture functional unit has four operand inputs 36a-d, for receiving operand data from registers R1, R2, R3, R4 and result outputs 38, 39 for outputting results to registers R5, R6.

Operand combination circuit 30 is arranged to form an output signal that contains N successive bit metrics, of which L bit metrics derive from the operand R1 at input 36a, and N−L from the operand R2 at input 36b, L being controlled by a length code from operand input 36c.

FIG. 4 shows an example of an embodiment of operand combination circuit 30. In this embodiment a shift circuit 40 and an OR circuit 42 are used. First operand input 36a is coupled to a first input of OR circuit 42, second operand input 36b is coupled to an input of shift circuit 40, which has an output coupled to a second input of OR circuit 42. Third operand input 36c is coupled to a control input of shift circuit 40. An output of OR circuit 42 and part of the output of shift circuit 40 forms the output of operand combination circuit.

Shift circuit 40 is implemented for example as a known barrel shift circuit, which has parallel input of which the most significant inputs receive M bits of the M-bit operand from second operand input 36b in parallel (M=32 for example), and of which the M less significant inputs receive logic zero values for example. Shift circuit 40 has 2*M parallel outputs, which output copies of the input signals shifted over L bit metric positions to less significant positions (i.e. if a bit metric is represented by four bits then a shift over 4*L bits is used). The amount of shift is controlled by third operand input 36c. At the most significant L bit metric positions shift circuit 40 outputs logic zero's. OR circuit 42 produces the bit-by-bit logic OR of M input bits from first operand input 36a and the most significant M output bits of shift circuit 40, the less significant M output bits of shift circuit 40 being fed directly to the output of operand combination circuit 30.

It should be appreciated that many alternative implementations are possible that realize the same function. As a simple example, if the circuit is arranged to include logic "1" values at the unused positions in first operand R1 a bit by bit AND circuit may be used instead of OR circuit 42. Inverted versions of the signals may be used etc.

Depuncturing circuit 32 is arranged to output copies of bit metrics from the output of operand combination circuit 30 to the outputs of depuncturing circuit 32, in the sequence in which these bit metrics are output from operand combination circuit 30. Between the bit metrics in the output sequence depuncturing circuit 32 inserts default bit metrics at selected positions, which are controlled by the operand from fourth operand input 36d.

FIG. 5 shows an embodiment of depuncturing circuit 32. This embodiment contains a plurality of multiplexing circuits 50, and a series of adder circuits 52. Adder circuits 52 from a chain, wherein each but the first adder circuit 52 has a first input coupled to an output of the preceding adder circuit 52, second inputs of adder circuits are coupled to respective bits from the fourth operand input 36d. Multiplexing circuits 50 each have a first input 54 coupled to a default bit metric source and one or more second bit metric inputs coupled to respective bit metrics outputs of operand combination circuit 30 (although single lines are shown it should be appreciated that each line may represent a plurality of data conductor, e.g. four data conductors for supplying respective bits of a bit metric). Multiplexing circuits 50 each have a control input coupled to respective bit from the fourth operand input 36d. Outputs of adder circuits 52 are coupled to respective further control inputs of multiplexing circuits 50.

In operation, respective bits of the operand from fourth operand input 36d correspond to respective groups of one or more bits for outputting bit metrics at the output of depuncturing circuit 32. Each respective bit of the operand from fourth operand input 36d indicates whether the corresponding group should contain a default bit metric or a bit metric from operand combination circuit 30. Multiplexing circuits 50 use these the bits from fourth operand input 36d to control whether a default bit metric or a bit metric from output combination circuit 30 will be passed. In addition outputs from adder circuits 52 control which of the bit metrics from operand combination circuit 30 will be passed. Each multiplexing circuit 50 passes the bit metric from the most significant position that is not passed by any other one of the multiplexing circuit 50 that is connected to more significant output bits at result output 39. Multiplexing circuits 50 may be numbered i=0, 1, 2, ... with increasing numbers "i" for multiplexing circuits 50 that connect to outputs of decreasing significance. Similarly the bits $B_j$ from fourth operand input 36d may be numbered with numbers j and the bit metrics $M_k$ from operand combination circuit 30 may be numbered with numbers k. According to this notation, adder circuits 52 control the multiplexing circuit 50 with number i to pass the bit metric $B_k$ whose number k equals the sum of the bits $B_j$ for which j<i.

It should be appreciated that FIG. 5 merely shows one possible embodiment of a depuncture circuit. As an example of an alternative a chain of controllable shift circuits may be used, wherein each shift circuit is controlled by a respective bit from the pattern. In this alternative the data from operand combination circuit 30 is applied to the start of the chain. Each part of depuncture output 39 (except for the first part) controllably receives a default bit metric value or a value from a respective shift register in the chain. Such a solution is feasibly if latency is not an issue, but as can be appreciated, a multiplexing implementation has the advantage that is generally will have less latency. The multiplexing circuits may be implemented in any know way, for example as logic circuits with a logic function that corresponds to a multiplexing function (copy data from a selected input to the output) or a switch circuit etc.

Operand update circuit 34 forms results for use as subsequent operand at the first operand input 36a. In one embodiment operand update circuit 34 is a shift circuit, which forms a result by shifting the output signal of operand combination circuit 30 to more significant positions. The amount of shift is controlled by to the number of bit metrics from operand combination circuit 30 that is output by depuncturing circuit 32, that is, the amount of shift corresponds to the content of the operand from fourth operand input 36d. Therefore the first result starts with the most significant bit metric that has not been output from depuncturing circuit 32 in response to the instruction. Preferably the operand from fourth operand input 36d contains, in addition to the bits that indicate where default bit metrics must be inserted, a number that represents the number of bit metrics that puncturing circuit 32 uses from input combination circuit 30. This reduces the minimum possible instruction cycle length. Alternatively, this number may be computed from the bits that indicate where default bit metrics must be inserted, using adder circuits 52 for example.

A program for the application of depuncturing to a stream of bits metrics preferably comprises the DEPUNCTURE instruction in a loop, to make the depuncture functional unit of FIG. 3 execute the DEPUNCTURE operation repeatedly. An example of instructions in such a loop is

```
repeat
            DEPUNCTURE R1, R2, R3, R4, R5, R1
            .... instructions for computing next R3 value
            .... and guard value R7 for loading new input
            STORE          A1++, R5
            LOAD           A2++, R4
IF R7     LOAD           A3++,R2
```

In this loop the result from result output 38 is stored into register R1 that is used as operand register R1 for supplying the operand to first operand input 36a. The depunctured output in register R5 is stored in memory at an address from an address register A1. An instruction is included in the loop for loading successive puncture patterns into register R4 from an address determined by an address register A2. A further instruction is included for loading a new second operand into register R2. A guarded load instruction is used for this purpose, which means that this instruction is completely executed only if a flag in a guard register R7 is set.

Furthermore, instructions are included for updating the length value in R3, and for computing a guard value in register R7. In one embodiment, the new length value L' is computed by means of the formula $$L'=L+I-M$$

Herein L is the previous length value that indicates the number of bit metrics that was present in the operand from first operand input 36a (as indicated by the operand from third operand input 36c). I is the number of bit metrics I from the operand from second operand input 36b. M depends on the pattern in register R4. M is the number bit metrics M from the output of input combination circuit 30 that has been used to form the result from depuncturing circuit 32. If L' is larger than the maximum number of bit metrics that can be stored in register R1, the instructions set R3 according to $$L'=L-M$$

instead. In this case the flag in R7 is set so that the loading of a new value into register R2 for use as the second operand is suppressed as well.

This method of computing length values and updating the input operand has the effect that the output rate at which bit depunctured results are written to result register R5 may differ from the input rate at which new register values will be loaded.

In a further embodiment, the depuncture functional unit is arranged to perform also the computation of the new length value and/or of the flag for register R7 in response to the DEPUNCTURE instruction. This is requires little operand overhead because all the information that is needed for this computation is already available at the operand inputs of the depuncture functional unit, so that no additional operand are required. Use of the depuncture functional unit for this purpose has the advantage that no additional instructions need to be loaded, or other functional units need to be occupied for this computation.

These computations can be supported for example by adding a comparator circuit for comparing L+I−M with the maximum number of bit metrics that fit in a result, and a computation circuit. The comparator circuit outputs the flag for register R7 and the computation circuit computes and outputs L+I−M or L−M, dependent on the flag value. With such a modified depuncture functional unit and a correspondingly modified DEPUNCTURE instruction, an example of the program loop is

```
        repeat
            DEPUNCTURE R1, R2, R3, R4, R5, R1, R7, R3
            STORE           A1++, R5
            LOAD            A2++, R4
    IF R7   LOAD A3++,R2
```

In this case the DEPUNCTURE instruction produces two additional results that are written to registers R7, R3 respectively. R7 receives the flag and R3 receives the updated length.

It should be appreciated that, as an alternative a plurality of different instructions, may be defined for performing respective parts of the DEPUNCTURE instruction. For example a bare DEPUNCTURE instruction may be defined, which merely forms the depuncture result R5, an OPERAND_UPDATE instruction may be defined that forms the updated operand R1 and an auxiliary instruction AUX may be defined that forms the additional results. In this case the program loop may be implemented as

```
        repeat
            DEPUNCTURE R1, R2, R3, R4, R5
            UPDATE_OPERAND R1, R2, R3, R4, R1
            AUX             R3, R4, R3, R7
            STORE           A1++, R5
            LOAD            A2++, R4
    IF R7   LOAD A3++,R2
```

Other alternatives are possible wherein pairs of these three new instructions may be combined into a single instruction. A single functional unit may be provided to execute each of these three or two of these instructions. Alternatively, three different functional units may be provided to execute respective ones of these instructions. If a VLIW or superscalar processor is used this has the advantaged that execution of the instructions can be performed in parallel, so that the number of instruction cycles that is needed for the loop can be reduced.

One example of an application of the programmable processing circuit according to the invention is to DVB decoding. During DVD decoding different puncture patterns may be used. For example puncture patterns with rates of ½, ⅔, ¾, ⅚ or ⅞ may be used for a stream that has been doubled by ECC encoding. The following table shows puncture patterns that may be used during encoding.

| Rate | puncture pattern |
|------|------------------|
| ½    | 11               |
| ⅔    | 1101             |
| ¾    | 110110           |
| ⅚    | 1101100110       |
| ⅞    | 11010101100110   |

The puncture pattern of a selected rate is applied to a stream of bits, successive symbols in the pattern corresponding to successive bits in the stream of bits. In the puncture pattern a "1" indicates that the corresponding bit remains in the stream and a 0 indicates that the corresponding bit should be omitted. When the stream of bits is longer than the length of the pattern, the pattern is repeated.

After transmission of the resulting stream bit metrics are computed that correspond to the transmitted bits. A program according to the invention uses the DEPUNCTURE instruction to insert default bit metrics at the positions where bits have been omitted and to produce results that each contain a predetermined number of bit metrics (as received or inserted).

By way of example the case will be discussed wherein each result contains eight bit metrics. The following table shows patterns that may be used in register R4 of a program to depuncture the stream

| Rate | pattern 1 | pattern 2 | pattern 3 | pattern 4 | pattern 5 |
|------|-----------|-----------|-----------|-----------|-----------|
| ½    | 11111111  | 11111111  | 11111111  | 11111111  | 11111111  |
| ⅔    | 11011101  | 11011101  | 11011101  | 11011101  | 11011101  |
| ¾    | 11011011  | 01101101  | 10110110  | 11011011  | 01101101  |
| ⅚    | 11011001  | 10110110  | 01101101  | 10011011  | 01100110  |
| ⅞    | 11010101  | 10011011  | 01010110  | 01101101  | 10110101  |

Successive columns show successive patterns that will be used during successive calls of the DEPUNCTURE instruction. As can be seen, the same pattern is used repeatedly for rate ½ and rate ⅔ decoding, because the number N of bit metrics in a result (N=8 in the example) equals an integer multiple of basic puncturing pattern. This is not the case for the other rates and therefore, different patterns are used for successive instruction calls for these rates, each patter containing an N bit chunk of a repetition of the corresponding basic pattern. In the case of rate ¾ encoding the patterns repeat after three instruction calls. In the case of a rate of ⅚ the pattern repeats after five instruction calls. In the case of a rate of ⅞ the pattern repeats after seven instruction calls (part of the cycle of patterns not shown in the table). Preferably, a modulo address computation is used (for example in the memory access unit) to compute the addresses for loading the patterns with an address repetition cycle appropriate for the particular rate.

In a further embodiment a predictive flag value may be computed for register R7, to determine whether L+I−M will be less than or equal to MAX (the maximum number of bit metrics that fit in a result) for the next execution of the loop. In this case the execution of the load instruction for the operand in register R2 can be postponed until this operand is actually used. Additionally, the definition of the DEPUNCTURE instruction and the depuncture functional unit for executing this instruction may be further modified so that this flag value is applied as a further operand of the instruction. In this case the depuncture functional unit may be adapted to substitute default values (e.g. logic zeroes) for the operand from register R2 when the flag indicates that no new operand has been loaded. This has the advantage that the value of register R2 does not matter, so that an undefined value in this register can be tolerated if the LOAD instruction is not completely executed. That is, invocation of the instruction may take the form

DEPUNCTURE R1, R2, R3, R4, R7, R5, R1

Here the flag register R7 serves as an input to control whether a default value is to be substituted for the content of R2.

The predictive flag value can be computed by additional instructions in the loop, but preferably, the depuncture functional unit is adapted to compute the predictive flag value. In this case the DEPUNCTURE instruction takes the form

DEPUNCTURE R1, R2, R3, R4, R7, R5, R1, R7, R3

For the computation of the predictive flag value information is needed about the number of bit metrics that will used from the input operand R1 according to a future pattern value in register R4. Preferably this information is included with the current pattern value in register R4, but alternatively a further operand may be used for this purpose.

During decoding of modulated signals it may be desirable to use a smaller number of bit metrics in the operand R2 than the maximum number of bit metrics that can be contained in the result that is written to R5. As a result, it may be necessary to load a plurality of operands before sufficient bit metrics are available for forming a result in R5. In an embodiment, this is supported by the depuncture functional unit so that the operands can be supplied via register R2 by means of repeated execution of the DEPUNCTURE instruction. For this purpose the depuncture functional unit is provided with a further result output for indicating whether the depunctured result is valid. An example of a program loop that uses a DEPUNCTURE instruction that is executed by such a depuncture functional unit may take the following form

```
            repeat
                DEPUNCTURE R1, R2, R3, R4, R5, R1, R8
                instructions to compute a new value for R3 and R7
                IF R8 STORE         A1++, R5
                IF R8 LOAD          A2++, R4
IF R7 LOAD  A3++, R2
```

In this loop execution of the STORE instruction for R5 is guarded by a flag from register R8, so that the store instruction will be executed completely only if the flag has an appropriate value. Similarly, execution of the LOAD instruction for loading the pattern into R4 is guarded by a flag from register R8, so that this load instruction will be executed completely only if the flag has an appropriate value. The flag is set by execution of the DEPUNCTURE instruction.

FIG. 6 shows an embodiment of a depuncture functional unit that may be used to execute this type of DEPUNCTURE instruction. Herein a computation/comparator circuit 60 has been added, with an output coupled to a result output 62 of the depuncture functional unit. Computation/comparator circuit 60 is arranged to compute the flag that will be written to R8 in the program example. Computation/comparator circuit 60 determines whether $$L+I<M$$

That is, whether the sum of the number L of bit metrics in the first operand input 36a and the number I of bit metrics in second operand input 36 is smaller than the number M of bit metrics that has to be output at result output 39. If so, the output flag at result output 62 is set to a value that will prevent the store instruction for R5 to complete. This has the effect that in a number of iterations of the program loop execution of the DEPUNCTURE instruction will merely serve to expand the number of bit metrics in register R1 until a sufficient number of bit metrics is available to produce a valid result in register R5.

Of course, the adaptations of the depuncture functional unit to supply the output result in R8 in response to the DEPUNCTURE instruction may be combined with the adaptations to compute of R3 and/or R7 in the depuncture functional unit in response to the DEPUNCTURE instruction. In this case a different version of the DEPUNCTURE instruction with more operands may be used. In this case, the separate instructions for computing these values may be omitted from the loop. The program loop may have the following form

```
            repeat
                DEPUNCTURE R1, R2, R3, R4, R5, R1, R3, R7, R8
                IF R8 STORE         A1++, R5
                IF R8 LOAD          A2++, R4
IF R7 LOAD  A3++, R2
```

In a DVB decoding operation for example, it may be desirable to supply four bit metrics for rate ¾ depuncturing. In this case, if results with N=8 bit metrics are used, two second operands need to be loaded before a valid depuncturing result can be produced. The following table shows an example of the numbers assumed by the various operands and results of instruction calls in this case

| call No | R3 (number of bit metrics in R1) | R4 (depuncture pattern) | R7 (load new operand) | R8 (output valid) |
|---|---|---|---|---|
| 1 | 0 | 11011011 | true | false |
| 2 | 4 | = | true | true |
| 3 | 2 | 01101101 | true | true |
| 4 | 1 | 10110110 | true | true |
| 5 | 0 | 11011011 | true | false |
| 6 | 4 | = | true | true |
| 7 | 2 | 01101101 | true | false |
| etc. | | | | |

In other embodiments the depuncture functional unit is adapted to handle a programmable number I of bit metrics in operand register R2. For DVB decoding for example, the demodulating operations produce different numbers of bit metrics for different modulation schemes. Therefore, it may be desirable to adapt the number of bit metrics. For example, for demodulation of a BPSK modulated signal I=2 bit metrics per second operand may be used, for demodulation of a 16QAM modulated signal I=4 bit metrics per operand may be used, for demodulation of a 64QAM modulated signal I=6 bit metrics per operand may be used and for demodulation of a 256QAM modulated signal I=8 bit metrics per operand may be used. The following table shows an example wherein I=6 bit metrics are used in each second operand for a rate=⅚ depuncturing operation.

| call No | R3 (number of bit metrics in R1) | R4 (depuncture pattern) | R7 (load new operand) | R8 (output valid) |
|---|---|---|---|---|
| 1 | 0 | 11011001 | true | true |
| 2 | 1 | 10110110 | true | true |
| 3 | 2 | 01101101 | true | true |
| 4 | 3 | 10011011 | true | true |
| 5 | 4 | 01100110 | true | true |
| 6 | 6 | 11011001 | true | true |
| 7 | 7 | 10110110 | true | true |
| 8 | 8 | 01101101 | true | true |
| 9 | 4 | 10011011 | false | true |
| 10 | 5 | 01100110 | true | true |
| 11 | 7 | 11011001 | true | true |
| etc. | | | | |

In a first embodiment, the number I may be indicated by the operation code of the DEPUNCTURE instruction. In this first embodiment the depuncture functional unit is arranged to execute instruction from a plurality of types with different operation code values, for example instructions which can be symbolically denoted as DEPUNCTURE2, DEPUNC- TURE4, DEPUNCTURE6, DEPUNCTURE8. In this first embodiment, the depuncture functional unit is designed to select the value I, whose function has been discussed above, dependent on the operation code. In the program selected ones of these instructions are used, dependent on the number of bit metrics that have been produced in the operand R2.

In a second embodiment the number I of bit metrics in the second operand R2 may be indicated by data in an additional operand of the DEPUNCTURE instruction. In this second embodiment, the depuncture functional unit is designed to retrieve the value I, whose function has been discussed above, from an input for receiving this additional operand. In the program a selected operand value is applied, dependent on the number of bit metrics that have been produced in the operand R2. In this second embodiment a single loop can be arranged to handle operands wherein the number I of bit metrics varies during the loop, for example dependent on position of the corresponding data within a transmission block.

In a third embodiment, the number I of bit metrics in the second operand R2 may be encoded in the operand R2 itself, e.g. by means of a special bit metric value which indicates the end of the series of available bit metric values. In this third embodiment, the depuncture functional unit is designed to determine the value I, whose function has been discussed above, from the content of the second operand R2.

FIG. 7 shows an embodiment of a depuncture functional unit that combines the adaptations to use of additional operand for specifying the number of bit metrics in operand R2 with the adaptations to computation of R3, R7 and R8. In the depuncture functional unit of this embodiment an auxiliary result computation circuit 70 has been added, as well as additional result outputs 72, 74 and an additional operand inputs 76, 78. A first additional operand input 76 is used to supply an operand R9 that specifies the number I of bit metrics at the second operand input 36b. A second additional operand input 78 is used to supply an operand R7 that indicates whether the operand at the second operand input 36b is valid. The first additional result output 72 is used to supply a length code R3 that indicates the number of bit metrics in the result at result output 38, for future use of this length code as input at third operand input 36c. The second additional result output 74 is used to supply a flag R7 that indicates whether a new second operand R2 is needed.

FIG. 8 shows an embodiment of auxiliary result computation circuit 70. In this embodiment auxiliary result computation circuit 70 comprises an adder circuit 80, a subtractor circuit 82, a comparator circuit 84, a multiplexing circuit 86, a zero substitution circuit 88 and a further comparator circuit 89.

Adder circuit 80 receives the operand from the third operand input 36c (indicating the number L of bit metrics in the operand at first operand input 36a) and an operand from first additional operand input 76 (indicating the number I of bit metrics in the operand at second operand input 36b), the latter via zero substitution circuit 88, which is controlled by second additional operand input 78. First adder circuit 80 outputs a sum L+I of the operand L from the third operand input 36c and the operand I from first additional operand input 76, unless second additional operand input 78 indicates that the second operand is invalid, in which case first adder circuit 80 outputs the operand L from the third operand input 36c.

Subtractor circuit 82 receives the result from adder circuit 80 and the operand from fourth operand input 36d. Subtractor circuit 82 forms a difference of the output from adder circuit 80 (I+L or L) and the number M of bit metrics that should be incorporated in the result according to the pattern from fourth operand input 36d. (Preferably, this fourth operand contains this number separately, so that the number can be used immediately, but alternatively this number may be computed from the pattern, using an additional adder circuit).

Comparator 84 determines whether the difference from subtractor circuit 82 is negative or not. The result of this comparison is output at flag output 62, to indicate whether the output from result output 39 can be used.

Multiplexing circuit 86 receives the output from adder circuit 80 and the output from subtractor circuit (L+I−M and L+I or L−M and L) as inputs and the output from comparator 84 as control input and passes the output signal from subtractor circuit 82 if that output does not represent a negative number and the output from adder circuit 80 otherwise. The output of multiplexing circuit 86 is supplied to additional result output 72 to indicate the number L' of bit metrics at result output 38.

Further comparator circuit 89 receives inputs L' from the output of multiplexing circuit 86, I from fourth operand input 36d and first additional operand input 76 (the latter indicating the number of bit metrics in the operand at second operand input 36b). Herein it is assumed that the operand from fourth operand input 36d indicates the number M' of bit metrics that should be incorporated in the result according to the pattern from a next future value at fourth operand input 36d. Similarly, it is assumed that the number of bit metrics I' according to a next future operand value at first additional operand input 76 will equal the current value I.

Further comparator circuit 89 serves to detect whether there will be enough room to incorporate the I' bit metrics in the second operand at second operand input 36b during a next future execution of the DEPUNCTURE instruction into the result at result output 39, i.e. whether L'+I'−M' does not exceed the maximum number MAX of bit metrics (e.g. MAX=8 bit metrics) that can be contained in the result at result output 38. The result of this comparison is used to control loading of a new value of the second operand.

Additionally the flag value that is output to output 62 is also supplied to operand update circuit 34. Operand update circuit 34 performs a shift operation to shift out M bit metrics from the combined first and second operands, but this shift is suppressed if the flag value indicates that L+I−M (or L−M) is not positive. Furthermore, the signal from second additional operand input 78 is supplied to operand combination circuit 30, which is arranged to ensure that the bit metrics from the first operand will not be affected by the second operand if the signal from second additional operand input 78 indicates that the second operand is not valid.

Of course, it should be appreciated that the invention is not limited to the embodiment that has been shown in FIG. 8. For example, equivalent results can be computed with many alternative circuits. Also, if no predictive flags are used the second additional operand input 78 and zero substitution circuit 88 may be omitted. In this case further comparator circuit 89 may be adapted to detect whether L+I−M does not exceed the maximum number MAX of bit metrics, and multiplexing circuit 86 may be adapted to output either L+I−M, L+I or L−M. In this case L+I−M is output when L+I at least equals M and L+I−M is not bigger than the maximum number MAX. L+I is output if L+I is less than M and L+I is not bigger than MAX. L−M is output if L+I−M is bigger than MAX and if L at least equals M.

Although a number of embodiments has been described wherein separate operand inputs serve to supply the different operands, it should be understood that some operands may be supplied in combination at a shared operand input, and/or that some results may be supplied in combination to a shared result output. A reduction of the number of operand inputs is advantageous because is reduces the required circuitry. For example, in one embodiment the length code that is supplied a third operand input 36c may be supplied together with the first operand at first operand input 36a. In this case the result outputs 38 and 62 that supply these operands preferably are also be combined. This may reduce the maximum of number of bit metrics that can be included in the first operand, but in certain applications this maximum number may never be needed.

As another example, the length code from first additional operand input 76 may be supplied with the second operand at second operand input 36b. Again this may reduce the maximum of number of bit metrics that can be included in the second operand, but this need not be a disadvantage in some applications, for example if the maximum is never needed. Similarly, the flag values may be combined with other results, if this does not affect their use. For example, the result flag that indicates whether the depunctured output is valid may be combined with the length code of the remaining bit metrics, if guarded execution does not depend on the presence of such a length code when the result is used as a guard, and when the depuncture functional unit is arranged to extract the length code appropriately from where it is present in an operand.

As another example, any one of the embodiments of the depuncture functional units that have been shown may be split into a plurality of functional units each for performing a separate instruction that is used to perform a respective part of the operations of the DEPUNCTURE instructions as shown. For example, separate functional units may be provided for performing instructions to execute the operations auxiliary result computation circuit 70 and the remainder of the depuncture functional unit of FIG. 7 respectively. As another example, separate functional units could be provided for executing instructions to compute the depunctured result (at output 39) and for computing the next first operand (at output 38). In a VLIW architecture such functional units can be made to execute instructions in parallel, which results essentially in the same speed of operation as when a single instruction is used to start all operations, however, with greater flexibility to schedule other instructions in the loop.

Furthermore, although examples have been shown wherein default bit metric values are inserted at the positions of punctured bits, it should be appreciated that alternatively the DEPUNCTURE instruction may provide for definition of the bit metric values that will be inserted, for example in the form of a single substitute value in an operand of the DEPUNCTURE instruction, to be used for all insertions, or in the form of a plurality of substitute values, to be used for respective puncture locations. An additional operand input may be provided for the depuncture functional unit to supply the substitute value or values, or the depuncture functional unit may be arranged to extract this value or these values from one or more of the described operands, for example in the pattern operand R4. These substitute bit metrics will be termed "predetermined" bit metrics, because they depend only on the program and not on the received data that is supplied in registers R1, R2.

Furthermore, although the invention has been described for depuncturing of a stream of bit metrics that each represent a single bit, it should be understood that the invention also applies to depuncturing where each bit metric represents a multibit code symbol, e.g. a two bit symbol.

In order to be able to supply the functional unit with sufficient operands and to write sufficient results a dedicated issue slot is typically provided for supplying DEPUNCTURE instructions from the instruction issue circuit to the functional unit and a sufficient number of read and write ports preferably corresponds to this issue slot. In an embodiment, further functional units may be coupled to this issue slot, for issuing instructions to such a functional unit when no instruction is issued to the depuncture functional unit A plurality of such further functional units may even be coupled to the issue slot in parallel, coupled to respective groups of the read and write ports to make more efficient use of these ports when no instruction is issued to the depuncture functional unit.

When a VLIW architecture is used, it is possible to issue a plurality of instructions in parallel with the DEPUNCTURE instruction. Thus the number of instruction cycles that is needed for one pass of the program loop can be reduced. The DEPUNCTURE instruction reduces the number of instructions with mutual data dependencies, which makes it possible to combine more of the instructions of the loop into the same VLIW instruction so that the number of instruction cycles that is needed for the loop can be kept small. This makes it easier to buffer the instructions of the loop, which in turn speeds up execution.

The invention claimed is:

1. A programmable signal processing circuit, comprising an operand storage circuit (22);
an instruction processing circuit (23, 24, 26), for executing instructions that address operand locations and result locations in the operand storage circuit (22), an instruction set of the instruction processing circuit (23, 24, 26) comprising a depuncture instruction, the instruction processing circuit (23, 24, 26) having an operand input (36a) for receiving a bit metric operand from a bit metric operand location indicated by the depuncture instruction and a result output (39) for writing a depuncture result to a result location indicated by the depuncture instruction, the instruction processing circuit (23, 24, 26) being arranged to form the depuncture result by copying bit metrics from the bit metrics operand and inserting one or more predetermined bit metric values between the bit metrics from the bit metric operand in the depuncture result, changing the relative locations of the copied bit metrics with respect to each other in the depuncture result as compared to the relative locations of the copied bit metrics with respect to each other in the bit metric operand, to an extent needed for accommodating the inserted predetermined bit metric value or values.

2. A programmable signal processing circuit according to claim 1, comprising at least one bit metric multiplexing circuit (50), with inputs coupled to the operand input (36a) for receiving a plurality of respective bit metrics from respective positions in the bit metric operand, an output coupled to the result output (39) for supplying a part of the depuncture result, and a control input (36d) coupled to receive a control signal derived from information specified by the depuncture instruction that controls the locations where predetermined bit pattern values must be inserted, for selecting to output the predetermined bit metric value or one of the bit metrics from the bit metric operand, dependent on whether said information specified by the depuncture instruction indicates that a bit metric should be copied from the bit metric operand to said part of the depuncture result and on a number of predetermined bit metric values that the pattern operand indicates should be inserted in further parts of the depuncture result that logically precede said part of the depuncture result.

3. A programmable signal processing circuit according to claim 1, comprising a controllable shift circuit coupled between the operand input (36a) and the result output (39) for supplying a part of the depuncture result, the controllable shift circuit having a control input coupled to receive a control signal derived from information specified by the depuncture instruction that controls the locations where predetermined bit pattern values must be inserted, for controlling a shift amount of the controllable shift circuit dependent on a number of predetermined bit metric values that said information specified by the depuncture instruction indicates should be inserted in further parts of the depuncture result that precede said part of the depuncture result.

4. A programmable signal processing circuit according to claim 1, wherein the instruction processing circuit (23, 24, 26) has a further operand input (26d) for receiving a pattern operand of the depuncture instruction, the pattern operand specifying a programmable depuncturing pattern, the instruction processing circuit (23, 24, 26) being arranged to control a location where it inserts the predetermined bit metric values in the depuncture result between the bit metrics from the bit metric operand dependent on the programmed depuncturing pattern specified in the pattern operand.

5. A programmable signal processing circuit according to claim 1, wherein the instruction set comprises a plurality of depuncture instructions, each defining a respective different location or combination of locations where the predetermined bit metric values must be inserted in the depuncture result between the bit metrics from the bit metric operand.

6. A programmable signal processing circuit according to claim 1, wherein the depuncture instruction has a further bit metric operand, the instruction processing circuit (23, 24, 26) being arranged to copy the bit metrics both from inputs (36a, b) for the bit metric operand and the further bit metric operand into the depuncture result if a number of bit metrics in the bit metric operand does not suffice to form the depuncture result.

7. A programmable signal processing circuit according to claim 6, wherein the instruction processing circuit is arranged to form a queue result in response to the depuncture instruction or a queuing instruction, by copying bit metrics that have not been included in the depuncture result from the plurality of operands into the queue result, and arranging the bit metrics in the queue result for use as the bit metric operand during a future execution of the depuncture instruction.

8. A programmable signal processing circuit according to claim 6, wherein the depuncture instruction has a length operand, for indicating a number of bit metrics that is present in the bit metric operand, the instruction processing circuit (23, 24, 26) being arranged to control a maximum number of bit metrics that will be copied from the bit metric operand into the depuncture result dependent on the length operand.

9. A programmable signal processing circuit according to claim 6, wherein the instruction processing circuit (23, 24, 26) is arranged to form an output valid result, dependent on whether at least a number of bit metrics that is required for forming the depuncture result is available in the bit metric operand and the further bit metric operand, the instruction processing circuit (23, 24, 26) writing the output valid result to the operand storage circuit (22).

10. A programmable signal processing circuit according to claim 6, wherein the instruction processing circuit (23, 24, 26) is arranged to form a queue result in response to the depuncture instruction or a queuing instruction, for use as bit metric operand during future execution of the depuncture instruction, by copying bit metrics that have not been copied to the depuncture result from the bit metric operand and the further bit metric operand into the queue result, the instruction processing circuit (23, 24, 26) writing the queue result to the operand storage circuit (22).

11. A programmable signal processing circuit according to claim 10, wherein the instruction processing circuit (23, 24, 26) is arranged to generate an indication whether a number of bit metrics that is required for forming the depuncture result is not in excess of a sum of numbers of bit metrics that are available in the bit metric operand and the further bit metric operand, the instruction processing circuit (23, 24, 26) writing the indication to the operand storage circuit (22).

12. A programmable signal processing circuit according to claim 1, wherein the instruction processing circuit (23, 24, 26) is arranged to generate an indication whether a number of bit metrics that is required for forming the depuncture result is available in the bit metric operand, the instruction processing circuit (23, 24, 26) writing the indication to the operand storage circuit (22).

13. A programmable signal processing circuit according to claim 1, wherein the depuncture instruction has a further bit metric operand, the instruction processing circuit being arranged to form a queue result in response to the depuncture instruction, for use as bit metric operand during future execution of the depuncture instruction, by copying bit metrics from the bit metric operand and at least one further bit metric from the further bit metric operand into the queue result, the instruction processing circuit (23, 24, 26) writing the queue result to the operand storage circuit (22).

14. A programmable signal processing circuit according to claim 13, wherein the depuncture instruction is arranged to indicate a bit metric count of bit metrics in the further bit metric operand, the instruction processing circuit being arranged to indicate in a result in response to the depuncture instruction whether or not all of the bit metrics from the further bit metric operand have been copied into the queue result.

15. A programmable signal processing circuit according to claim 1, programmed with a program to perform depuncturing of a stream of input metrics, the program comprising
one or more instructions to load successive chunks of the stream into an operand storage location;
a depuncture instruction having a bit metric operand that selects said operand storage location.

16. A method of correcting a punctured data stream, the method comprising
receiving a signal that represents the data stream;
deriving a stream of bit metrics from the data stream;
repeatedly causing a programmable instruction processor to execute a depuncture instruction,
providing a bit metric operand for the execution of the depuncture instruction, each bit metric operand containing a respective plurality of bit metrics from the stream of bit metrics;
forming depunctured results in response to executions of the depuncture instruction, by inserting predetermined bit metric values in at least part of the depunctured results between selected pairs of bit metrics from the bit metric operand, changing the relative locations of the copied bit metrics with respect to each other in the depuncture result as compared to the relative locations of the copied bit metrics with respect to each other in the bit metric operand, to an extent needed for accommodating the inserted predetermined bit metric value or values;
decoding error corrected data from the depunctured results using instructions decoded by the programmable instruction processor.

17. A method according to claim 15, the method comprising
supplying successively different pattern operands of the depuncture instruction to the programmable instruction execution unit for respective executions of the depuncture instruction and selecting locations between the bit metrics for insertion of the predetermined bit metric values during execution of each depuncture instruction under control of the pattern operand of the depuncture instruction.

18. A method according to claim 17, the method comprising forming a queue result in response to the depuncture instruction or a further instruction that receives a further bit metric operand, which contains a chunk from the stream of bit metrics with a predetermined number of bit metrics, in addition to the bit metric operand, the pattern operand and a queue length code, the queue length code specifying a number of bit metrics in the bit metric operand, the queue result being formed in response to the depuncture instruction or the further instruction by placing a pattern operand dependent number of bit metrics into the queue result that, according to the pattern operand, are not copied into the depuncture result from said number of bit metrics in the bit metric operand in the execution of the depuncture instruction, a pattern operand dependent number of bit metrics being combined in the queue result with bit metrics from the further bit metric operand;

using the queue result as bit metric operand for a subsequent execution of the depuncture instruction.

19. A method according to claim 18, comprising computing a queue length result that indicates a number of bit metrics in the queue result, and setting that number of bit metrics in the queue result to the number of bit metrics in the bit metric operand minus the number of bit metrics that have been copied from the bit metric operand into the depuncture result, provided that there is sufficient room in the queue result for copying all bit metrics from the further bit metric operand into the queue result in addition to bit metrics from the bit metric operand that have not been used in the depuncture result;

repeating execution of the depuncture instruction or the further instruction with a same further bit metric operand and respective different pattern values and successive queue results until there is sufficient room in the queue result for copying all bit metrics from the further bit metric operand into the queue result.

20. A method according to claim 18, comprising supplying a length value in addition to a depuncture pattern in the pattern operand, and using the length value in response to the depuncture instruction or the further instruction to control a number of bit metric values that is copied from the further bit metric operand into the queue result.

21. A method according to claim 17, comprising supplying a further bit metric operand, which contains a chunk from the stream of bit metrics with a predetermined number of bit metrics, as operand for the execution of the depuncture instruction, in addition to the bit metric operand, the pattern operand and a queue length code, the queue length code specifying a number of bit metrics in the bit metric operand, the depuncture result being formed by placing a pattern operand dependent number of bit metrics from the bit metric operand into the depuncture result, if said number of bit metrics in the bit metric operand is sufficient to supply sufficient copies for use in the depuncture result.

22. A method according to claim 21, the method comprising forming a queue result in response to the depuncture instruction or a further instruction, which receives the further bit metric operand, in addition to the bit metric operand, the pattern operand and a queue length code, the queue result being formed by placing a pattern operand dependent number of bit metrics into the queue result that, according to the pattern operand, are not used by the depuncture operation from said number of bit metrics in the bit metric operand or the further bit metric operand, the pattern operand dependent number of bit metrics from the bit metric operand and bit metrics from the further bit metric operand being combined in the queue result;

using the queue result as bit metric operand for a subsequent execution of the depuncture instruction.

23. A method according to claim 22, wherein execution of the depuncture instruction or further instruction is repeated with a same pattern operand, and with successive further bit metric operands until the bit metric operand and the further bit metric operand together contain sufficient bit metrics to form said depuncture result for said same pattern operand during execution of the depuncture instruction.

24. A method according to claim 22, comprising executing the depuncture instruction using chunks of respectively different predetermined number of bit metrics.

* * * * *

UNITED STATES PATENT AND TRADEMARK OFFICE
CERTIFICATE OF CORRECTION

PATENT NO. : 7,853,860 B2
APPLICATION NO. : 11/721053
DATED : December 14, 2010
INVENTOR(S) : Paulus W. F. Gruijters et al.

It is certified that error appears in the above-identified patent and that said Letters Patent is hereby corrected as shown below:

Column 16
Lines 21-43, Claim 1 should read as follows:

1. A programmable signal processing circuit, comprising
an operand storage circuit;
an instruction processing circuit, for executing instructions that address operand locations and result locations in the operand storage circuit, an instruction set of the instruction processing circuit comprising a depuncture instruction, the instruction processing circuit having an operand input for receiving a bit metric operand from a bit metric operand location indicated by the depuncture instruction and a result output for writing a depuncture result to a result location indicated by the depuncture instruction, the instruction processing circuit being arranged to form the depuncture result by copying bit metrics from the bit metrics operand and inserting one or more predetermined bit metric values between the bit metrics from the bit metric operand in the depuncture result, changing the relative locations of the copied bit metrics with respect to each other in the depuncture result as compared to the relative locations of the copied bit metrics with respect to each other in the bit metric operand, to an extent needed for accommodating the inserted predetermined bit metric value or values.

Column 16, Line 44 through Column 17, Line 7
Claims 2-3 should read as follows:

2. A programmable signal processing circuit according to claim 1, comprising at least one bit metric multiplexing circuit, with inputs coupled to the operand input for receiving a plurality of respective bit metrics from respective positions in the bit metric operand, an output coupled to the result output for supplying a part of the depuncture result, and a control input coupled to receive a control signal derived from information specified by the depuncture instruction that controls the locations where predetermined bit pattern values must be inserted, for selecting to output the predetermined bit metric value or one of the bit metrics from the bit metric operand, dependent on whether said information specified by the depuncture instruction indicates that a bit metric should be copied from the bit metric operand to said part of the depuncture result and on a number of Signed and Sealed this
Fifteenth Day of February, 2011

David J. Kappos
*Director of the United States Patent and Trademark Office*

CERTIFICATE OF CORRECTION (continued)
U.S. Pat. No. 7,853,860 B2 predetermined bit metric values that the pattern operand indicates should be inserted in further parts of the depuncture result that logically precede said part of the depuncture result.

3. A programmable signal processing circuit according to claim 1, comprising a controllable shift circuit coupled between the operand input and the result output for supplying a part of the depuncture result, the controllable shift circuit having a control input coupled to receive a control signal derived from information specified by the depuncture instruction that controls the locations where predetermined bit pattern values must be inserted, for controlling a shift amount of the controllable shift circuit dependent on a number of predetermined bit metric values that said information specified by the depuncture instruction indicates should be inserted in further parts of the depuncture result that precede said part of the depuncture result.

<u>Column 17, Lines 8-23</u>
Claims 4-5 should read as follows:

4. A programmable signal processing circuit according to claim 1, wherein the instruction processing circuit has a further operand input for receiving a pattern operand of the depuncture instruction, the pattern operand specifying a programmable depuncturing pattern, the instruction processing circuit being arranged to control a location where it inserts the predetermined bit metric values in the depuncture result between the bit metrics from the bit metric operand dependent on the programmed depuncturing pattern specified in the pattern operand.

5. A programmable signal processing circuit according to claim 1, wherein the instruction set comprises a plurality of depuncture instructions, each defining a respective different location or combination of locations where the predetermined bit metric values must be inserted in the depuncture result between the bit metrics from the bit metric operand.

<u>Column 17, Lines 24-45</u>
Claims 6-8 should read as follows:

6. A programmable signal processing circuit according to claim 1, wherein the depuncture instruction has a further bit metric operand, the instruction processing circuit being arranged to copy the bit metrics both from inputs for the bit metric operand and the further bit metric operand into the depuncture result if a number of bit metrics in the bit metric operand does not suffice to form the depuncture result.

7. A programmable signal processing circuit according to claim 6, wherein the instruction processing circuit is arranged to form a queue result in response to the depuncture instruction or a queuing instruction, by copying bit metrics that have not been included in the depuncture result from the plurality of operands into the queue result, and arranging the bit metrics in the queue result for use as the bit metric operand during a future execution of the depuncture instruction.

8. A programmable signal processing circuit according to claim 6, wherein the depuncture instruction has a length operand, for indicating a number of bit metrics that is present in the bit metric operand, the instruction processing circuit being arranged to control a maximum number of bit metrics that will be copied from the bit metric operand into the depuncture result dependent on the length operand.

<u>Column 17, Line 46 through Column 18, Line 4</u>
Claims 9-11 should read as follows:

9. A programmable signal processing circuit according to claim 6, wherein the instruction processing circuit is arranged to form an output valid result, dependent on whether at least a number of bit metrics that is required for forming the depuncture result is available in the bit metric operand and the further bit metric operand, the instruction processing circuit writing the output valid result to the operand storage circuit.

10. A programmable signal processing circuit according to claim 6, wherein the instruction processing circuit is arranged to form a queue result in response to the depuncture instruction or a queuing instruction, for use as bit metric operand during future execution of the depuncture instruction, by copying bit metrics that have not been copied to the depuncture result from the bit metric operand and the further bit metric operand into the queue result, the instruction processing circuit writing the queue result to the operand storage circuit.

11. A programmable signal processing circuit according to claim 10, wherein the instruction processing circuit is arranged to generate an indication whether a number of bit metrics that is required for forming the depuncture result is not in excess of a sum of numbers of bit metrics that are available in the bit metric operand and the further bit metric operand, the instruction processing circuit writing the indication to the operand storage circuit.

<u>Column 18, Lines 5-21</u>
Claims 12-13 should read as follows:

12. A programmable signal processing circuit according to claim 1, wherein the instruction processing circuit is arranged to generate an indication whether a number of bit metrics that is required for forming the depuncture result is available in the bit metric operand, the instruction processing circuit writing the indication to the operand storage circuit.

13. A programmable signal processing circuit according to claim 1, wherein the depuncture instruction has a further bit metric operand, the instruction processing circuit being arranged to form a queue result in response to the depuncture instruction, for use as bit metric operand during future execution of the depuncture instruction, by copying bit metrics from the bit metric operand and at least one further bit metric from the further bit metric operand into the queue result, the instruction processing circuit writing the queue result to the operand storage circuit.